(12) United States Patent
Zhang et al.

(10) Patent No.: US 8,105,093 B2
(45) Date of Patent: Jan. 31, 2012

(54) SOCKET ASSEMBLY FOR FIXING AN IC ON A CIRCUIT PLATE

(75) Inventors: Xue-Feng Zhang, Shenzhen (CN); Feng-Hao Ku, Miao-Li County (TW); Yu-Feng Xia, Shenzhen (CN)

(73) Assignees: Innocom Technology (Shenzhen) Co., Ltd., Shenzhen, Guangdong Province (CN); Chimei Innolux Corporation, Miao-Li County (TW)

( * ) Notice: Subject to any disclaimer, the term of this patent is extended or adjusted under 35 U.S.C. 154(b) by 0 days.

(21) Appl. No.: 12/949,824

(22) Filed: Nov. 19, 2010

(65) Prior Publication Data

US 2011/0124208 A1    May 26, 2011

(30) Foreign Application Priority Data

Nov. 20, 2009 (CN) .......................... 2009 1 0310145

(51) Int. Cl.
*H01R 12/01* (2006.01)
(52) U.S. Cl. .......................................................... 439/70
(58) Field of Classification Search .................. 439/70, 439/68, 330; 29/739, 747, 761, 884, 837, 29/593; 24/10 R, 10 CT
See application file for complete search history.

(56) References Cited

U.S. PATENT DOCUMENTS

| | | | | |
|---|---|---|---|---|
| 3,735,466 A | * | 5/1973 | Jensen | 29/739 |
| 3,849,838 A | * | 11/1974 | Hehl | 24/305 |
| 5,317,803 A | * | 6/1994 | Spigarelli et al. | 29/840 |
| 6,435,882 B1 | * | 8/2002 | Pitou | 439/70 |
| 7,059,045 B2 | * | 6/2006 | Lu et al. | 29/840 |
| 7,101,195 B2 | * | 9/2006 | Brooks | 439/70 |
| 7,635,268 B2 | | 12/2009 | Nikaido et al. | |
| 7,819,686 B2 | * | 10/2010 | Chen et al. | 439/330 |
| 7,918,671 B2 | * | 4/2011 | Chen et al. | 439/70 |
| 2004/0175967 A1 | * | 9/2004 | Liao | 439/68 |
| 2004/0211061 A1 | * | 10/2004 | Farnworth | 29/884 |
| 2011/0124208 A1 | * | 5/2011 | Zhang et al. | 439/70 |

FOREIGN PATENT DOCUMENTS

CN    101110509 A    1/2008

* cited by examiner

*Primary Examiner* — Alexander Gilman
(74) *Attorney, Agent, or Firm* — Altis Law Group, Inc.

(57) ABSTRACT

An exemplary socket assembly includes a circuit plate and a socket mounted on the circuit plate for fixing an IC. The socket includes a first fixing member and a second fixing member. The first fixing member includes installed portions, elastic connecting portions, and a first buckling portion, the elastic connecting portions interconnects the electric portions and the first buckling portion. The second fixing member includes electric portions, elastic connecting portions, and a second buckling portion, and the elastic connecting portions interconnect the electric portions and the second buckling portion. Wherein when the IC is attached to the socket, the first buckling portion and the second buckling portion are initially disengaged from each other, pins of the IC is electrically connected with the electric portions, the first buckling portion and the second buckling portion are brought together with the elastic connecting portions elastically deforming, and the first buckling portion and the second buckling portion are locked together and hold the IC in the socket.

20 Claims, 5 Drawing Sheets

US 8,105,093 B2

SOCKET ASSEMBLY FOR FIXING AN IC ON A CIRCUIT PLATE

BACKGROUND OF THE DISCLOSURE

1. Field of the Disclosure

The present disclosure generally relates to socket assemblies, and more particularly to a socket assembly for fixing an IC (integrated circuit) on a circuit plate.

2. Description of Related Art

A circuit plate bears a variety of electrical components thereon, such as one or more ICs. An IC is often mounted on the circuit plate by SMT (Surface Mount Technology). However, using SMT makes the IC difficult to remove later on, for example in the case where the IC requires replacement. In the process of removal, a tin element connecting the IC and the circuit plate must be melted. The process is inconvenient and time consuming. Furthermore, in the process of removal, the IC can easily sustain damage.

What is needed, therefore, is an IC assembly which can overcome the described limitations.

BRIEF DESCRIPTION OF THE DRAWINGS

The components in the drawings are not necessarily drawn to scale, the emphasis instead placed upon clearly illustrating the principles of at least one embodiment. In the drawings, like reference numerals designate corresponding parts throughout the various views, and all the views are schematic.

DESCRIPTION OF EMBODIMENTS

Reference will now be made to the drawings to describe preferred and exemplary embodiments in detail.

Figure 1:
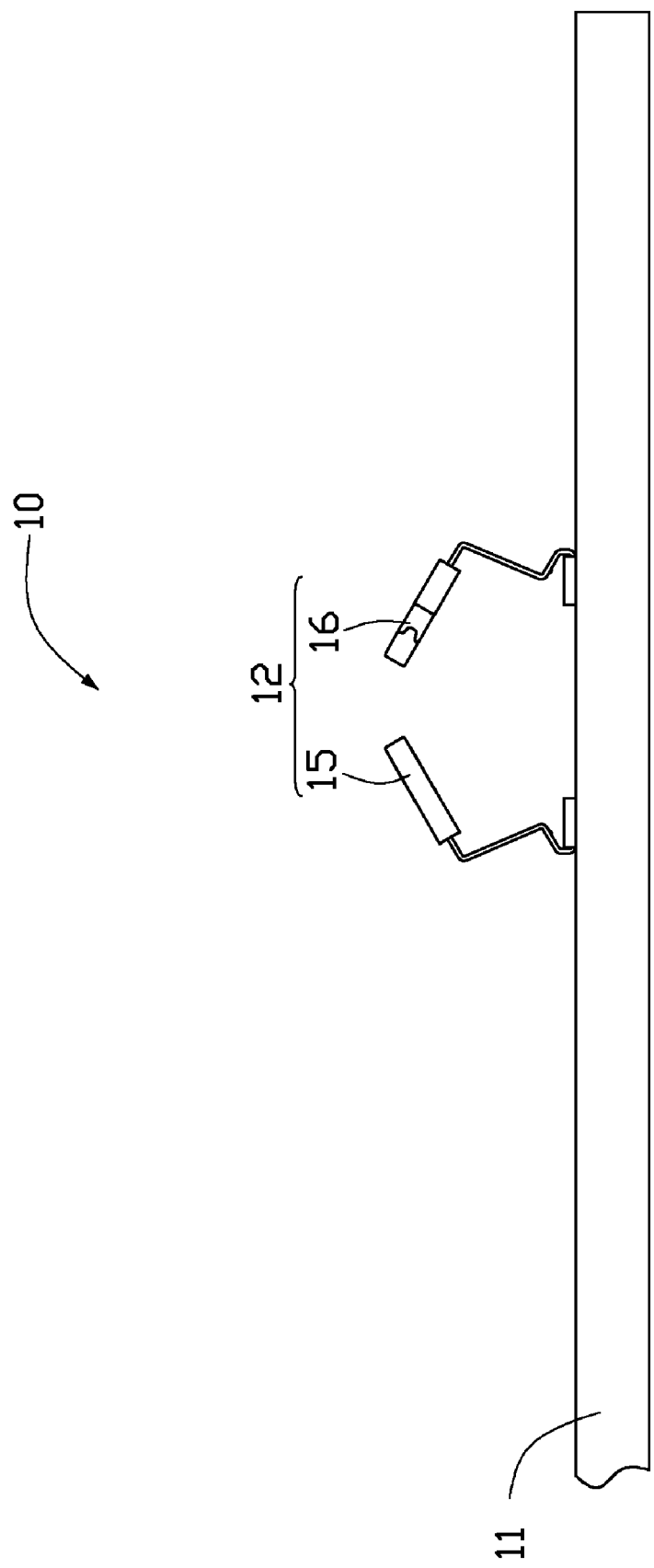
FIG. 1 is a schematic view of a socket assembly according to an exemplary embodiment of the present disclosure, the socket assembly including a socket mounted on a circuit plate, the socket shown in an unlocked position.

Referring to FIG. 1, a schematic view of a socket assembly according to an exemplary embodiment of the present disclosure is shown. The socket assembly 10 includes a circuit plate 11, and a socket 12 mounted on the circuit plate 11 by SMT. The socket 12 includes a first fixing member 15 and a second fixing member 16. An IC can be securely fixed in the socket 12 by the cooperation of the first fixing member 15 and the second fixing member 16.

Figure 2:
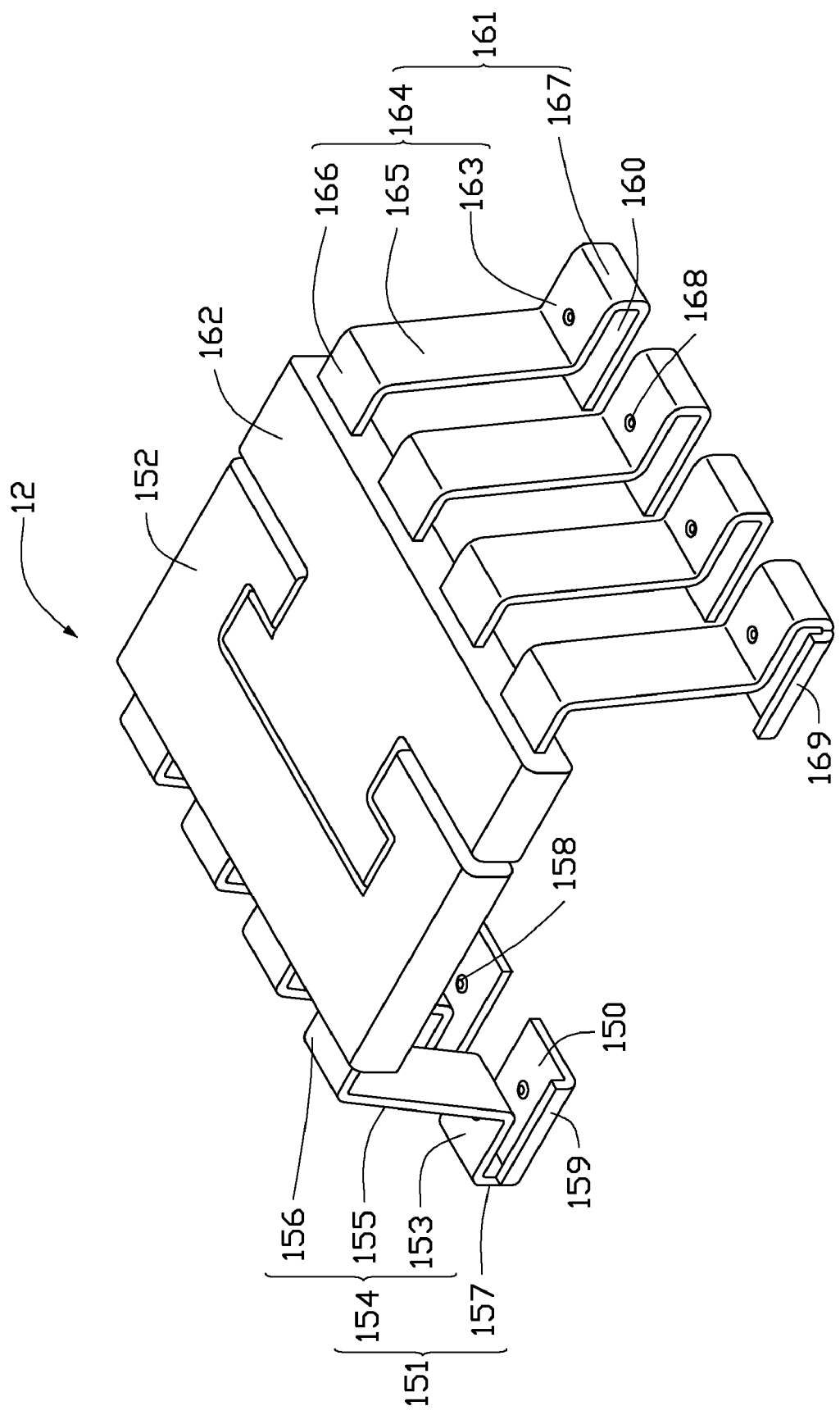
FIG. 2 is an enlarged, isometric view of the socket of FIG. 1, but showing the socket in a locked position.
Figure 3:
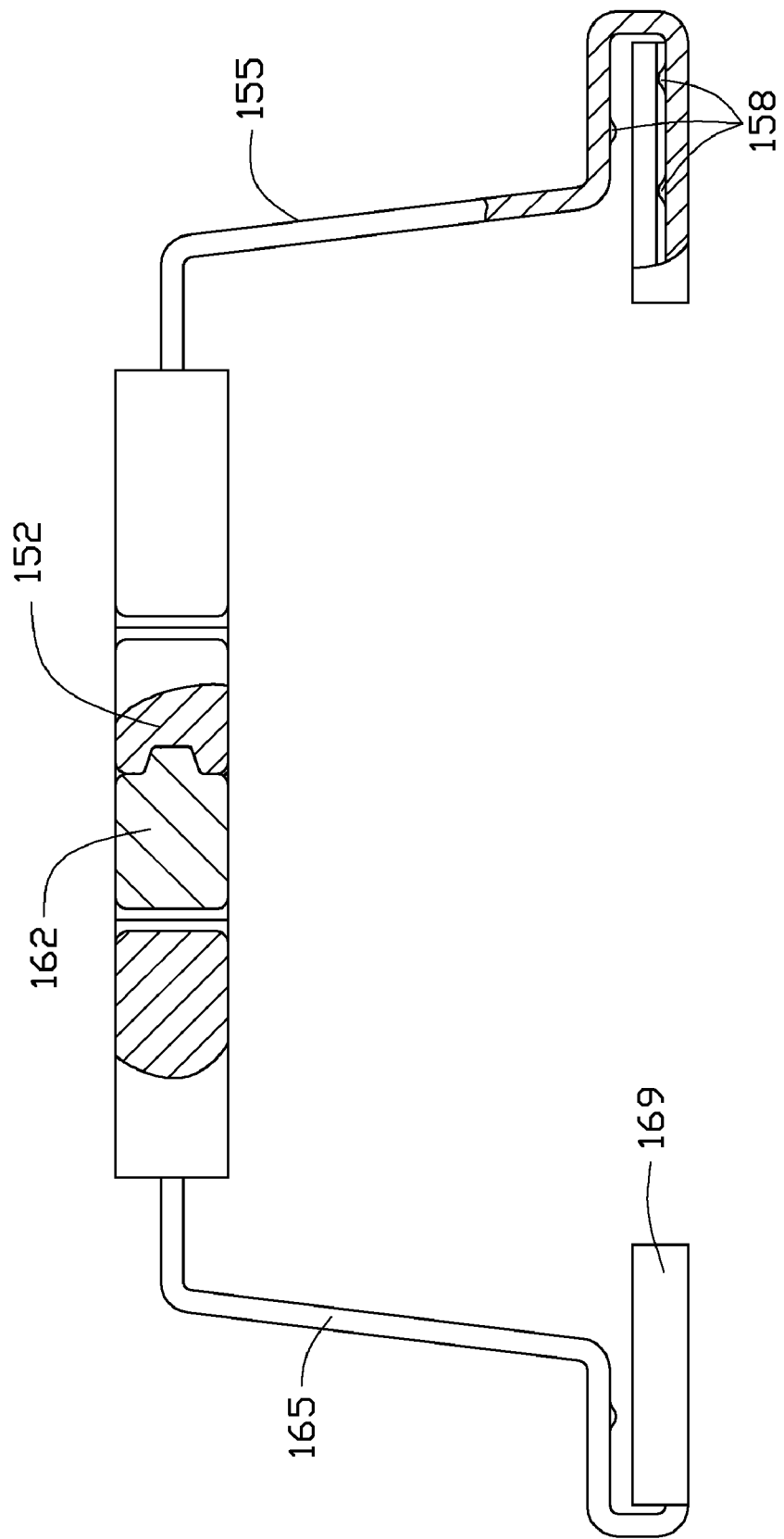
FIG. 3 is an enlarged, rear end plan view of the socket of FIG. 2, with part of the socket cut away.

Referring also to FIGS. 2-3, the first fixing member 15 includes a first buckling portion 152, a plurality of installed portions 150, and a plurality of elastic connecting portions 151 elastically interconnecting the first buckling portion 152 and the installed portions 150, respectively. The installed portions 150 are used for contacting the circuit plate 11 to mount the first fixing member 15 on the circuit plate 11. In this embodiment, the installed portions 150 are evenly spaced apart from each other. A bottom surface (not labeled) of each installed portion 150 contacts the circuit plate 11. Because the installed portion 150 electrically connects with both the circuit plate 11 and the IC, the installed portion 150 may also be known as an "electric portion." The first buckling portion 152 may be a flat plate including two opposite long sides (not labeled). The first buckling portion 152 defines a buckling groove (not labeled) at one of the two opposite sides. The buckling groove may be a generally T-shaped groove.

The elastic connecting portions 151 are elastically deformable, and extend from the other of the two opposite sides of the first buckling portion 152. The plurality of elastic connecting portions 151 correspond to the plurality of installed portions 150. Each elastic connecting portion 151 includes an elastic arm 154 and a connecting arm 157. The elastic arm 154 may be made by bending an elastic strip, and includes a first strip 153, a second strip 155, and a third strip 156. The third strip 156 extends horizontally from the side of the first buckling portion 152, the first strip 153 is substantially parallel to the third strip 156, and the second strip 155 interconnects the third strip 156 and the first strip 153. A corresponding installed portion 150 is parallel to the first strip 153, and the connecting arm 157 is connected with the first strip 153 and the corresponding installed portion 150. The connecting arm 157 may directly extend from the installed portion 150. A bottom surface of the first strip 153 and a top surface of the installed portion 150 each include at least one electric protrusion 158. In the illustrated embodiment, the electric protrusions 158 are in the form of bosses. One electric protrusion 158 is positioned on the bottom surface of the first strip 153, and two electric protrusions 158 are positioned on the top surface of the installed portion 150. The electric protrusion 158 on the first strip 153 is staggered halfway between the electric protrusions 158 on the installed portion 150.

In the case of each of two endmost of the installed portions 150, a blocking protrusion 159 extends upwardly from an outside edge of a main body of the installed portion 150. Each blocking protrusion 159 is located at an endmost extremity of the series of installed portions 150.

The second fixing member 16 includes a second buckling portion 162, a plurality of installed portions 160, and a plurality of elastic connecting portions 161 elastically interconnecting the second buckling portion 162 and the installed portions 160, respectively. The installed portions 160 are used for contacting the circuit plate 11, so as to mount the second fixing member 16 on the circuit plate 11. In this embodiment, the installed portions 160 are evenly spaced apart from each other. A bottom surface (not labeled) of each installed portion 160 contacts the circuit plate 11. Because the installed portion 160 electrically connects with both the circuit plate 11 and the IC, the installed portion 160 may also be known as an "electric portion." The second buckling portion 162 may be a flat plate including two opposite long sides (not labeled). The second buckling portion 162 defines a protrusion (not labeled) at one of the two opposite sides. The protrusion may be a generally T-shaped protrusion, and corresponds in shape and size to the buckling groove of the first buckling portion 152. That is, the protrusion can be disengagably locked in the buckling groove, such that the second buckling portion 162 is prevented from sliding off or being pulled off the first buckling portion 152.

The elastic connecting portions 161 are elastically deformable, and extend from the other of the two opposite sides of the second buckling portion 162. The plurality of elastic connecting portions 161 correspond to the plurality of installed portions 160. Each elastic connecting portion 161 includes an elastic arm 164 and a connecting arm 167. The elastic arm 164 may be made by bending an elastic strip, and includes a first strip 163, a second strip 165, and a third strip 166. The third strip 166 extends horizontally from the side of the second buckling portion 162, the first strip 163 is substantially parallel to the third strip 166, and the second strip 165 interconnects the third strip 166 and the first strip 163. A corresponding installed portion 160 is parallel to the first strip 163, and the connecting arm 167 is connected with the first strip 163 and the corresponding installed portion 160. The connecting arm 167 may directly extend from the installed portion 160. A bottom surface of the first strip 163 and a top surface of the installed portion 160 each include at least one electric protrusion 168. In the illustrated embodiment, the electric protrusions 168 are in the form of bosses. One electric protrusion 168 is positioned on the bottom surface of the first strip 163, and two electric protrusions 168 are positioned on the top surface of the installed portion 160. The electric protrusion 168 on the first strip 163 is staggered halfway between the electric protrusions 168 on the installed portion 160.

In the case of each of two endmost of the installed portions 160, a blocking protrusion 169 extends upwardly from an outside edge of a main body of the installed portion 160. Each blocking protrusion 169 is located at an endmost extremity of the series of installed portions 160.

Figure 4:
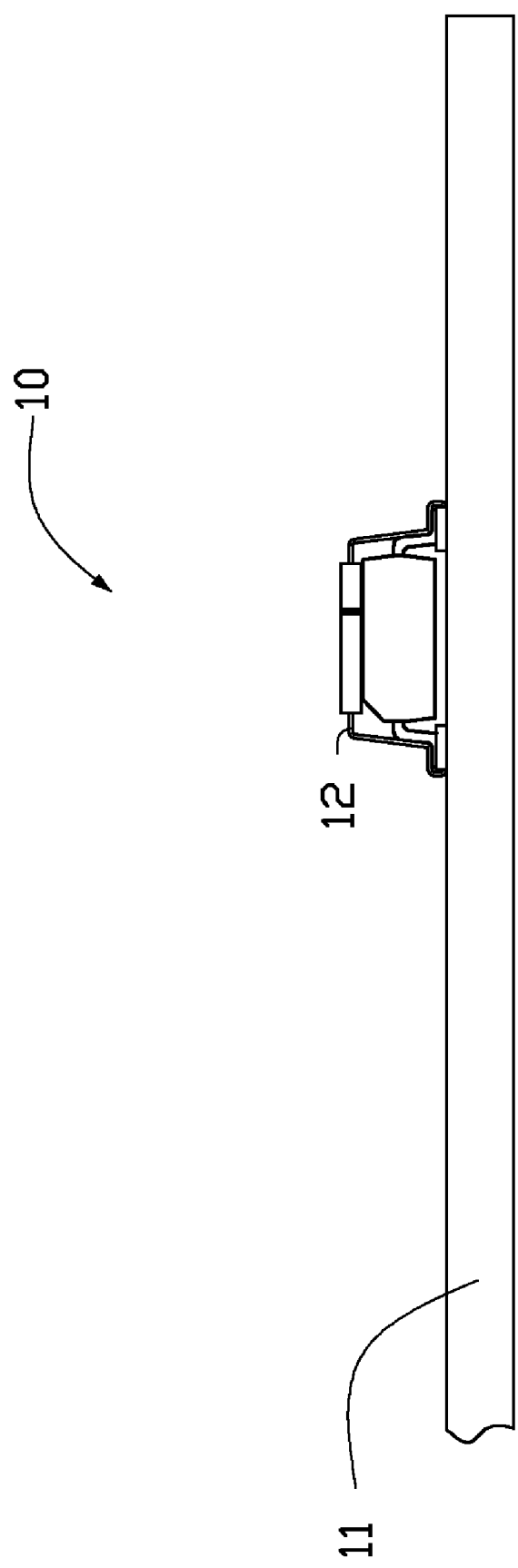
FIG. 4 is similar to FIG. 1, but showing the socket in the locked position with an IC engaged in the socket.
Figure 5:
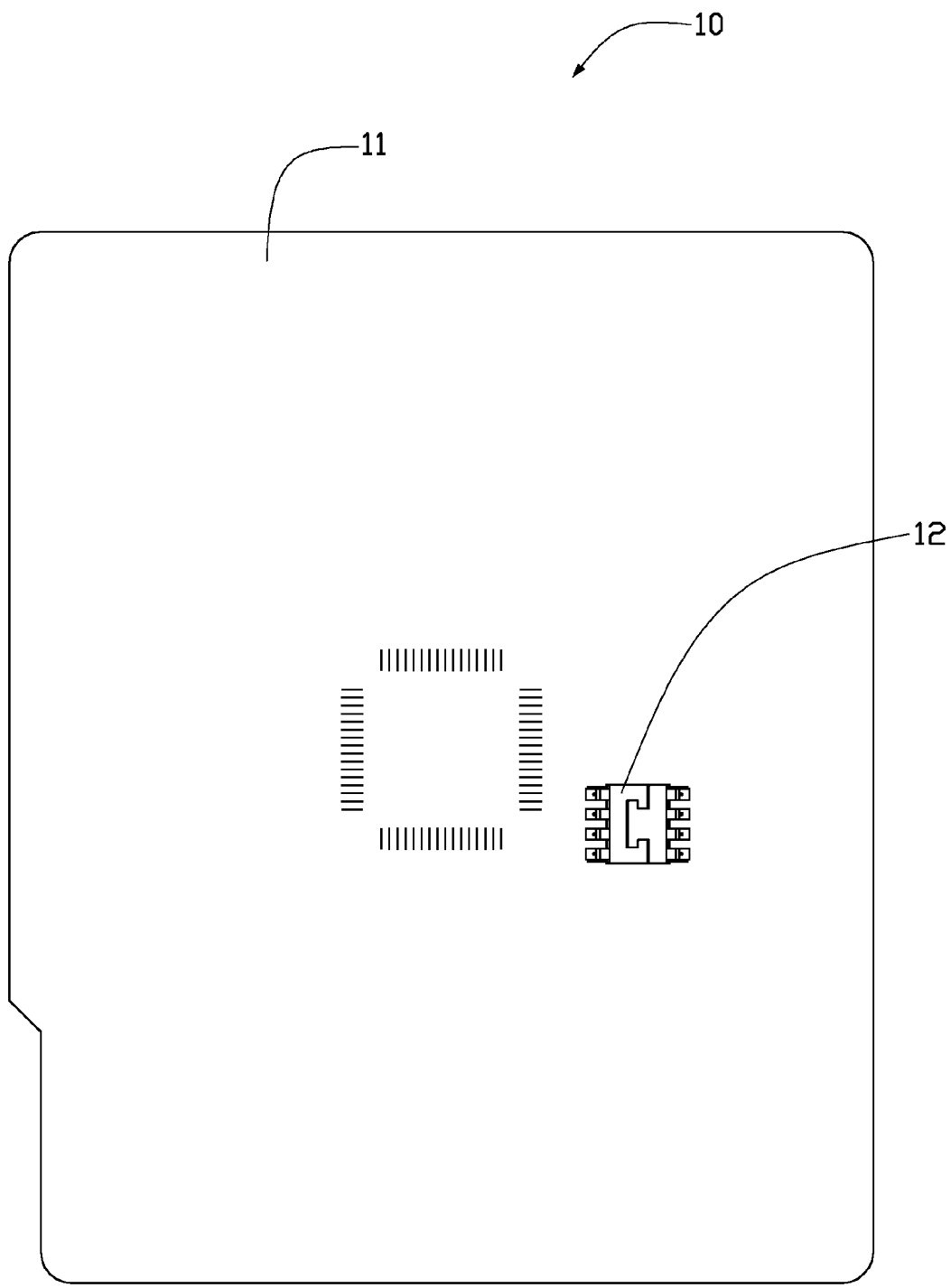
FIG. 5 is a top plan view of the socket assembly of FIG. 4.

Referring also to FIGS. 4-5, in use of the socket assembly 10, the starting position of the socket assembly 10 may be that shown in FIGS. 2 and 3. From such starting position, the protrusion of the second buckling portion 162 is disengaged from the buckling groove of the first buckling portion 152. The elastic connecting portions 151, 161 thereby elastically deform, and the distance between the set of elastic connecting portions 151 and the set of elastic connecting portions 161 increases. In this position, the socket 12 is opened, as shown in FIG. 1. An IC has a row of pins at each of two opposite lateral sides thereof. The IC is inserted in the socket 12, with a distal end of each pin of the IC received in a space cooperatively formed by a corresponding one of the first strips 153 or 163 and the corresponding installed portion 150 or 160. The pins of the IC are thus electrically connected with the electric protrusions 158, 168 of the first strips 153, 163 and the installed portions 150, 160, to ensure reliable operation of the IC. The protrusion of the second buckling portion 162 is engaged in the buckling groove of the first buckling portion 152, and the second buckling portion 162 is thus locked to the first buckling portion 152. The IC is now received in the socket 12. The first buckling portion 152 and the second buckling portion 162 abut a top surface of the IC. The second strips 155, 165 abut intermediate portions of the pins at the two opposite sides of the IC. The two blocking protrusions 159, 169 abut two opposite ends of the IC to prevent the IC from sliding out of the socket 12.

In the fully assembled position, the socket 12 is mounted on the circuit plate 11, with the IC locked in the socket 12. The IC can be removed from the socket 12 by disengaging the protrusion of the second buckling portion 162 from the buckling groove of the first buckling portion 152. The IC can then be conveniently removed from the socket 12. In summary, because the IC is easily inserted into and removed from the socket 12, assembly and disassembly of the IC to and from the socket assembly 10 is both convenient and speedy.

With the above-described configuration, the socket 12 firmly retains the IC therein. When inserting the IC into the socket 12, the IC can be quickly and securely engaged in the socket 12. Similarly, the IC can be quickly and safely removed from the socket 12 when needed.

The socket assembly herein is not limited to the above-described embodiments. For example, the socket may include only one installed portion of the first fixing member, and only one installed portion of the second fixing member. The quantity of the installed portions 150, 160 can be configured according to particular requirements. The quantity of the elastic connecting portions 151, 161 can be configured according to particular requirements too.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

What is claimed is:

1. A socket assembly, comprising:
a socket mounted on a circuit plate for holding an integrated circuit (IC), the socket comprising:
a first fixing member, comprising at least one electric portion, at least one elastic connecting portion, and a first buckling portion, the at least one elastic connecting portion interconnecting the at least one electric portion and the first buckling portion; and
a second fixing member, comprising at least one electric portion, at least one elastic connecting portion, and a second buckling portion, the at least one elastic connecting portion interconnecting the at least one electric portion and the second buckling portion;
wherein when the IC is attached to the socket, the first buckling portion and the second buckling portion are initially disengaged from each other, at least one pin of the IC is electrically connected with at least one of the electric portions, the first buckling portion and the second buckling portion are brought together with the elastic connecting portions elastically deforming, and the first buckling portion and the second buckling portion are locked together and hold the IC in the socket.

2. The socket assembly of claim 1, wherein the first fixing member comprises a plurality of installed portions serving as a plurality of the electric portions, the installed portions of the first fixing member are spaced apart from each other and mounted on the circuit plate, the second fixing member comprises a plurality of installed portions serving as a plurality of the electric portions, and the installed portions of the second fixing member are spaced apart from each other and mounted on the circuit plate.

3. The socket assembly of claim 2, wherein the at least one elastic connecting portion of the first fixing member is a plurality of elastic connecting portions, the at least one elastic connecting portion of the second fixing member is a plurality of elastic connecting portions, the plurality of installed portions of the first fixing member are connected to the plurality of elastic connecting portions of the first fixing member, and the plurality of installed portions of the second fixing member are connected to the plurality of elastic connecting portions of the second fixing member.

4. The socket assembly of claim 3, wherein the first buckling portion comprises a flat plate comprising two opposite sides, the first buckling portion defines a buckling groove at one of the two opposite sides thereof, the second buckling portion comprises a flat plate comprising two opposite sides, and the second buckling portion defines a protrusion at one of the two opposite sides thereof.

5. The socket assembly of claim 4, wherein the elastic connecting portions of the first fixing member extend from the other of the two opposite sides of the first buckling portion, each elastic connecting portion of the first fixing member comprises an elastic arm connecting to the first buckling portion and a connecting arm connecting to a corresponding installed portion of the first fixing member, the elastic connecting portions of the second fixing member extend from the other of the two opposite sides of the second buckling portion, and each elastic connecting portion of the second fixing member comprises an elastic arm connecting to the second buckling portion and a connecting arm connecting to a corresponding installed portion of the second fixing member.

6. The socket assembly of claim 5, wherein the elastic arm of the first fixing member is a bent elastic strip, and the elastic arm of the second fixing member is a bent elastic strip.

7. The socket assembly of claim 6, wherein the elastic arm of the first fixing member comprises a first strip, a second strip and a third strip, the third strip extends horizontally from the side of the first buckling member, the first strip is parallel to the third strip, and the second strip interconnects the first strip and the third strip.

8. The socket assembly of claim 7, wherein the elastic arm of the second fixing member comprises a first strip, a second strip and a third strip, the third strip extends horizontally from the side of the second buckling member, the first strip is parallel to the third strip, and the second strip interconnects the first strip and the third strip.

9. The socket assembly of claim 8, wherein a bottom surface of each first strip of the first fixing member comprises at least one electric protrusion, a top surface of each installed portion of the first fixing member comprises at least one electric protrusion, a bottom surface of each first strip of the second fixing member comprises at least one electric protrusion, and a top surface of each installed portion of the first fixing member comprises at least one electric protrusion.

10. The socket assembly of claim 2, wherein two blocking protrusions extend upwardly from outside edges of two endmost of the installed portions of the first fixing member, and two blocking protrusions extend upwardly from outside edges of two endmost of the installed portions of the second fixing member.

11. A socket assembly, comprising:
a circuit plate;
a socket mounted on the circuit plate for holding an integrated circuit (IC), the socket comprising:
a first fixing member, comprising a plurality of electric portions, a plurality of elastic connecting portions, and a first buckling portion, the elastic connecting portions interconnecting the electric portions and the first buckling portion; and
a second fixing member, comprising a plurality of electric portions, a plurality of elastic connecting portions, and a second buckling portion, the elastic connecting portions interconnecting the electric portions and the second buckling portion;
wherein when the IC is attached to the socket, the first buckling portion and the second buckling portion are initially disengaged from each other with the elastic connecting portions of the first and second fixing members in relaxed states, the IC is inserted into the socket with pins of the IC electrically connecting with the electric portions of the first and second fixing members, the first buckling portion and the second buckling portion are brought together with the elastic connecting portions of the first and second fixing members elastically deforming and pressing the pins of the IC on the electric portions of the first and second fixing members, and the first buckling portion and the second buckling portion are locked together such that the IC is detachably fixed in the socket.

12. The socket assembly of claim 11, wherein the first fixing member comprises a plurality of installed portions serving as a plurality of the electric portions, the installed portions of the first fixing member are spaced apart from each other and mounted on the circuit plate, the second fixing member comprises a plurality of installed portions serving as a plurality of the electric portions, and the installed portions of the second fixing member are spaced apart from each other and mounted on the circuit plate.

13. The socket assembly of claim 12, wherein the at least one elastic connecting portion of the first fixing member is a plurality of elastic connecting portions, the at least one elastic connecting portion of the second fixing member is a plurality of elastic connecting portions, the plurality of installed portions of the first fixing member are connected to the plurality of elastic connecting portions of the first fixing member, and the plurality of installed portions of the second fixing member are connected to the plurality of elastic connecting portions of the second fixing member.

14. The socket assembly of claim 13, wherein the first buckling portion comprises a flat plate comprising two opposite sides, the first buckling portion defines a buckling groove at one of the two opposite sides thereof, the second buckling portion comprises a flat plate comprising two opposite sides, and the second buckling portion defines a protrusion at one of the two opposite sides thereof.

15. The socket assembly of claim 14, wherein the elastic connecting portions of the first fixing member extend from the other of the two opposite sides of the first buckling portion, each elastic connecting portion of the first fixing member comprises an elastic arm connecting to the first buckling portion and a connecting arm connecting to a corresponding installed portion of the first fixing member, the elastic connecting portions of the second fixing member extend from the other of the two opposite sides of the second buckling portion, and each elastic connecting portion of the second fixing member comprises an elastic arm connecting to the second buckling portion and a connecting arm connecting to a corresponding installed portion of the second fixing member.

16. The socket assembly of claim 15, wherein the elastic arm of the first fixing member is a bent elastic strip, and the elastic arm of the second fixing member is a bent elastic strip.

17. The socket assembly of claim 16, wherein the elastic arm of the first fixing member comprises a first strip, a second strip and a third strip, the third strip extends horizontally from the side of the first buckling member, the first strip is parallel to the third strip, and the second strip interconnects the first strip and the third strip.

18. The socket assembly of claim 17, wherein the elastic arm of the second fixing member comprises a first strip, a second strip and a third strip, the third strip extends horizontally from the side of the second buckling member, the first strip is parallel to the third strip, and the second strip interconnects the first strip and the third strip.

19. The socket assembly of claim 18, wherein a bottom surface of each first strip of the first fixing member comprises at least one electric protrusion, a top surface of each installed portion of the first fixing member comprises at least one electric protrusion, a bottom surface of each first strip of the second fixing member comprises at least one electric protrusion, and a top surface of each installed portion of the first fixing member comprises at least one electric protrusion.

20. The socket assembly of claim 12, wherein two blocking protrusions extend upwardly from outside edges of two endmost of the installed portions of the first fixing member, and two blocking protrusions extend upwardly from outside edges of two endmost of the installed portions of the second fixing member.

* * * * *